United States Patent
Seki et al.

(10) Patent No.: US 7,323,789 B2
(45) Date of Patent: Jan. 29, 2008

(54) MULTIPLE CHIP PACKAGE AND IC CHIPS

(75) Inventors: Fusao Seki, Kawasaki (JP); Tatsushi Otsuka, Kawasaki (JP); Masanori Kurita, Kawasaki (JP); Shinnosuke Kamata, Kawasaki (JP); Toshiya Uchida, Kawasaki (JP); Hiroyoshi Tomita, Kawasaki (JP); Hiroyuki Kobayashi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 115 days.

(21) Appl. No.: 11/043,993

(22) Filed: Jan. 28, 2005

(65) Prior Publication Data

US 2006/0092752 A1    May 4, 2006

(30) Foreign Application Priority Data

Oct. 28, 2004    (JP) ............................. 2004-313411

(51) Int. Cl.
    *G11C 8/00*    (2006.01)
(52) U.S. Cl. ................. 257/786; 327/297; 257/E23.085
(58) Field of Classification Search ................. 257/734
    See application file for complete search history.

(56) References Cited

U.S. PATENT DOCUMENTS 6,078,514 A * 6/2000 Takemae et al. ............... 365/63
6,297,842 B1 * 10/2001 Koizumi et al. ............ 347/237
6,519,688 B1 * 2/2003 Lu et al. ..................... 711/167

FOREIGN PATENT DOCUMENTS

| JP | 3-198283 | 8/1991 |
| JP | 2000-194594 | 7/2000 |

* cited by examiner

*Primary Examiner*—Leonardo Andujar
*Assistant Examiner*—Krista Soderholm
(74) *Attorney, Agent, or Firm*—Arent Fox LLP

(57) ABSTRACT

A clock output pad and a return clock receiving pad are disposed on a logic chip at a portion near a side of an integrated circuit chip and a portion near another side of the integrated circuit chip that opposes to the side. A clock receiving pad is disposed on a memory chip at portion near the side and the other side respectively. The clock receiving pad is electrically connected to the clock output pad and the return clock receiving pad. A plurality of clock signals are supplied from the logic chip to the memory chip, and a plurality of return clock signals are returned from the memory chip to the logic chip.

2 Claims, 9 Drawing Sheets

MULTIPLE CHIP PACKAGE AND IC CHIPS

CROSS-REFERENCE TO RELATED APPLICATIONS

This application is based upon and claims the benefit of priority from the prior Japanese Patent Application No. 2004-313411, filed on Oct. 28, 2004, the entire contents of which are incorporated herein by reference.

BACKGROUND OF THE INVENTION

1) Field of the Invention

The present invention relates to a multiple chip package that includes a plurality of integrated circuit (IC) chips enclosed in a single package, and the IC chips in the package.

2) Description of the Related Art

FIG. 1 is a schematic of an internal configuration of a conventional horizontal multiple chip package. As shown in FIG. 1, in the horizontal multiple chip package, a logic chip 1 and a memory chip 2 are laid out horizontally. A clock signal CLK is supplied to the logic chip 1 from outside via an external clock input pad 11. The logic chip 1 outputs an address signal, a control signal, and a data signal, in synchronism with the clock signal CLK. The logic chip 1 also outputs the clock signal CLK via a clock output pad 12. The clock signal CLK is supplied to the memory chip 2 via a wire electrode 31 and a clock input pad 21.

The memory chip 2 inputs the address signal, the control signal, and the data signal, and outputs the data signal, in synchronism with the clock signal CLK supplied from the logic chip 1. A return clock signal CLK (hereinafter, "return clock signal ReCLK") is supplied from the clock input pad 21 of the memory chip 2 to the logic chip 1, via a wire electrode 32 and a return clock receiving pad 13 of the logic chip 1. The logic chip 1 receives the data signal from the memory chip 2 in synchronism with the return clock signal ReCLK.

FIG. 2 is a schematic of an internal configuration of a conventional stacked multiple chip package. As shown in FIG. 2, in the stacked multiple chip package, the logic chip 1 and the memory chip 2 are vertically stacked. Similarly to the horizontal multiple chip package, the clock signal CLK output from the clock output pad 12 is returned to the return clock receiving pad 13 of the logic chip 1 as the return clock signal ReCLK, via the clock input pad 21.

In both of the horizontal multiple chip package shown in FIG. 1 and the stacked multiple chip package shown in FIG. 2, the clock output pad 12, output pads 14 of address signals and control signals, the return clock receiving pad 13, and input/output pads 15 of data signals are all disposed along one side of the logic chip 1. The clock input pad 21, input pads 22 of address signals and control signals, and input/output pads 23 of data signals are all disposed along one side of the memory chip 2. Clock trees 16 and 17 and a latch circuit 18 inside the logic chip 1, and a clock tree 24 and a latch circuit 25 inside the memory chip 2, respectively adjust the input timing and the output timing of the control signal, the address signal, and the data signal so that these timings become uniform.

In recent trend, the number of pins in the multiple chip package is increasing. This requires wider band width and higher clock frequency. Therefore, the adjustment of timing inside the logic chip 1, the adjustment of timing inside the memory chip 2, and the adjustment of timing between the chips become more difficult. FIG. 3 is a schematic of an internal configuration of a conventional stacked multiple chip package having multiple pins.

As shown in FIG. 3, in the multiple-pinned logic chip 1, the input/output pads 15 of data signals are disposed not only along a side (a right side in FIG. 3) on which the clock output pads 12 and the return clock receiving pads 13 are disposed but also along another side (a left side in FIG. 3). The clock signal CLK is supplied to the data output side of the latch circuit 18 connected to the input/output pads 15 at the left side, via the clock tree 16 of the clock signal CLK. The return clock signal ReCLK is supplied to the data input side of the latch circuit 18 connected to the input/output pad 15, via the clock tree 17 of the return clock signal ReCLK.

In the multiple-pinned memory chip 2, the input/output pads 23 of data signals are disposed not only along a side (the right side in FIG. 3) on which the clock input pads 21 are disposed but also along another side (the left side in FIG. 3). While the intermediate part of the clock tree 24 of the clock signal CLK is not shown in FIG. 3, the clock tree 24 is actually extended to the left side from the clock input pad 21 at the right side. The clock signal CLK is supplied to the latch circuit 25 connected to the input/output pads 23 at the left side, via the long clock tree 24.

There is a memory control circuit configured as follows. In the memory control circuit, a data bus driver and a receiver are disposed in isolation. The data bus is connected from the driver of the data bus to the receiver. A memory module of a synchronous dynamic random access memory (SDRAM) is connected to the data bus. A clock signal line is connected to each SDRAM such that signal propagation delay times are equal, and a signal works as a synchronization signal for fetching data read by the receiver of the memory control circuit. Such a memory control circuit is disclosed in, for example, Japanese Patent Application Laid-open No. 2000-194594. According to a technology disclosed in this patent literature, a difference between the phase of the read data and the phase of the reading clock can be kept constant. Even when number of mounted SDRAM dual in line memory (DIMM) increases, timing margin between the read data and the reading clock can be maintained.

A semiconductor memory that includes internal circuits that operate following clock signals, and a plurality of independent clock input terminals that supplies the clock signals to the internal circuits of the semiconductor chips is disclosed in, for example, Japanese Patent Application Laid-open No. H3-198283. According to the technology disclosed in this patent literature, the length of a clock signal line within the semiconductor chips can be shortened. Therefore, impedance of the clock signal line becomes small, and a deviation of the clock signals due to positions on the semiconductor chips can be made smaller.

According to the above multiple chip package that includes the multiple pins, a delay of the clock signal CLK between the logic chip 1 and the memory chip 2 is small. However, the input/output timings of all the signals of the logic chip 1 are adjusted based on one clock signal CLK and one return clock signal ReCLK. The input/output timings of all the signals of the memory chip 2 are adjusted based on one clock signal CLK. Therefore, the wiring lengths of the clock trees 16, 17, and 24 within the chips 1 and 2 become long, and delays of the clock signal CLK and the return clock signal ReCLK within the chips 1 and 2 become large. On the other hand, when the clock frequency becomes high according to the increase in the number of pins, a timing window becomes small. Therefore, it becomes difficult to adjust timings.

SUMMARY OF THE INVENTION

It is an object of the present invention to solve at least the above problems in the conventional technology.

A multiple chip package according to one aspect of the present invention accommodates a plurality of integrated circuit chips, and includes a first integrated circuit chip that includes a clock output pad that outputs a clock signal; and a return clock receiving pad that receives a return signal based on the clock signal; and a second integrated circuit chip that includes a clock receiving pad to which the clock signal is supplied and that outputs the return signal. The clock output pad and the return clock receiving pad are arranged near a plurality of sides of the first integrated circuit chip, and the clock receiving pad is electrically connected to the clock output pad and the return clock receiving pad.

A multiple chip package according to another aspect of the present invention accommodates a plurality of integrated circuit chips, and includes a first integrated circuit chip that includes a clock output pad that outputs a clock signal, and a return clock receiving pad that receives a return signal based on the clock output signal; and a second integrated circuit chip that includes a clock receiving pad to which the clock signal is supplied, and a dummy pad to which the clock signal is supplied, and that is not connected to an internal circuit. The clock output pad and the return clock receiving pad are arranged near a plurality of sides of the first integrated circuit chip. The clock input pad is electrically connected to the clock output pad that is arranged near one of the sides and the return clock receiving pad that is arranged near one of the sides, and the dummy pad is electrically connected to the clock output pad that is arranged near another of the sides and the return clock receiving pad that is arranged near another of the sides.

A multiple chip package according to still another aspect of the present invention accommodates a plurality of integrated circuit chips, and includes a first integrated circuit chip that includes a clock output pad that outputs a clock signal, and a return clock receiving pad that receives a return signal based on the clock output signal; a second integrated circuit chip that includes a clock receiving pad to which the clock signal is supplied; and a dummy pad that is arranged on a substrate of the multiple chip package. The clock output pad and the return clock receiving pad are arranged near a plurality of sides of the first integrated circuit chip. The clock receiving pad is electrically connected to the clock output pad that is arranged near one of the sides and the return clock receiving pad that is arranged near one of the sides, and The dummy pad is electrically connected to the clock output pad that is arranged near another of the sides and the return clock receiving pad that is arranged near another of the sides, without being connected to any other circuit.

A multiple chip package according to still another aspect of the present invention accommodates a plurality of integrated circuit chips, and includes a first integrated circuit chip that includes a clock output pad that outputs a clock signal, and a return clock receiving pad that receives a return signal based on the clock signal; a second integrated circuit chip that includes a plurality of clock receiving pads, to each of which the clock signal is supplied. The clock output pad is arranged near a plurality of sides of the first integrated circuit chip and the return clock receiving pad is arranged near one of the sides in the first integrated circuit pad. Each of the clock receiving pads is electrically connected to the clock output pad that is arranged near one of the sides, and one of the clock receiving pads is electrically connected to the return clock receiving pad.

An integrated circuit chip according to still another aspect of the present invention includes a clock output pad that outputs a clock signal; and a return clock receiving pad that receives a return signal based on the clock signal. The clock output pad and the return clock receiving pad are arranged near each of a plurality of sides of the integrated circuit chip.

An integrated circuit chip according to still another aspect of the present invention includes a clock output pad that outputs a clock signal; and a return clock receiving pad that receives a return signal based on the clock signal. The clock output pad is arranged near a plurality of sides of the integrated circuit chip, and the return clock receiving pad is arranged near one of the sides.

An integrated circuit chip according to still another aspect of poi includes a plurality of pad groups each of which includes a plurality of pads. An input and an output of a signal to and from each of the pad groups are controlled based on a clock signal for each of the pad groups.

An integrated circuit chip according to still another aspect of the present invention includes a clock receiving pad to which a clock signal is supplied from outside; a dummy pad to which the clock signal is supplied from the outside; an input circuit to which the clock receiving pad is connected; and a dummy input circuit that is not connected to an internal circuit. A configuration and a size of the dummy pad are same as those of the clock receiving pad, and a configuration and a size of the dummy input circuit are same as those of the input circuit. The dummy pad is connected to the dummy input circuit.

The other objects, features, and advantages of the present invention are specifically set forth in or will become apparent from the following detailed description of the invention when read in conjunction with the accompanying drawings.

DETAILED DESCRIPTION

Exemplary embodiments of a multiple chip package and IC chips according to the present invention will be explained below in detail with reference to the accompanying drawings. Although not limited thereto, a first IC chip is a logic chip and a second IC chip is a memory chip. The multiple chip package in each embodiment has a structure such that the logic chip and the memory chip are stacked. In the explanations of each embodiment and the accompanying drawings, like constituent elements are designated by like reference signs, and redundant explanations therefor will be omitted.

Figure 4:
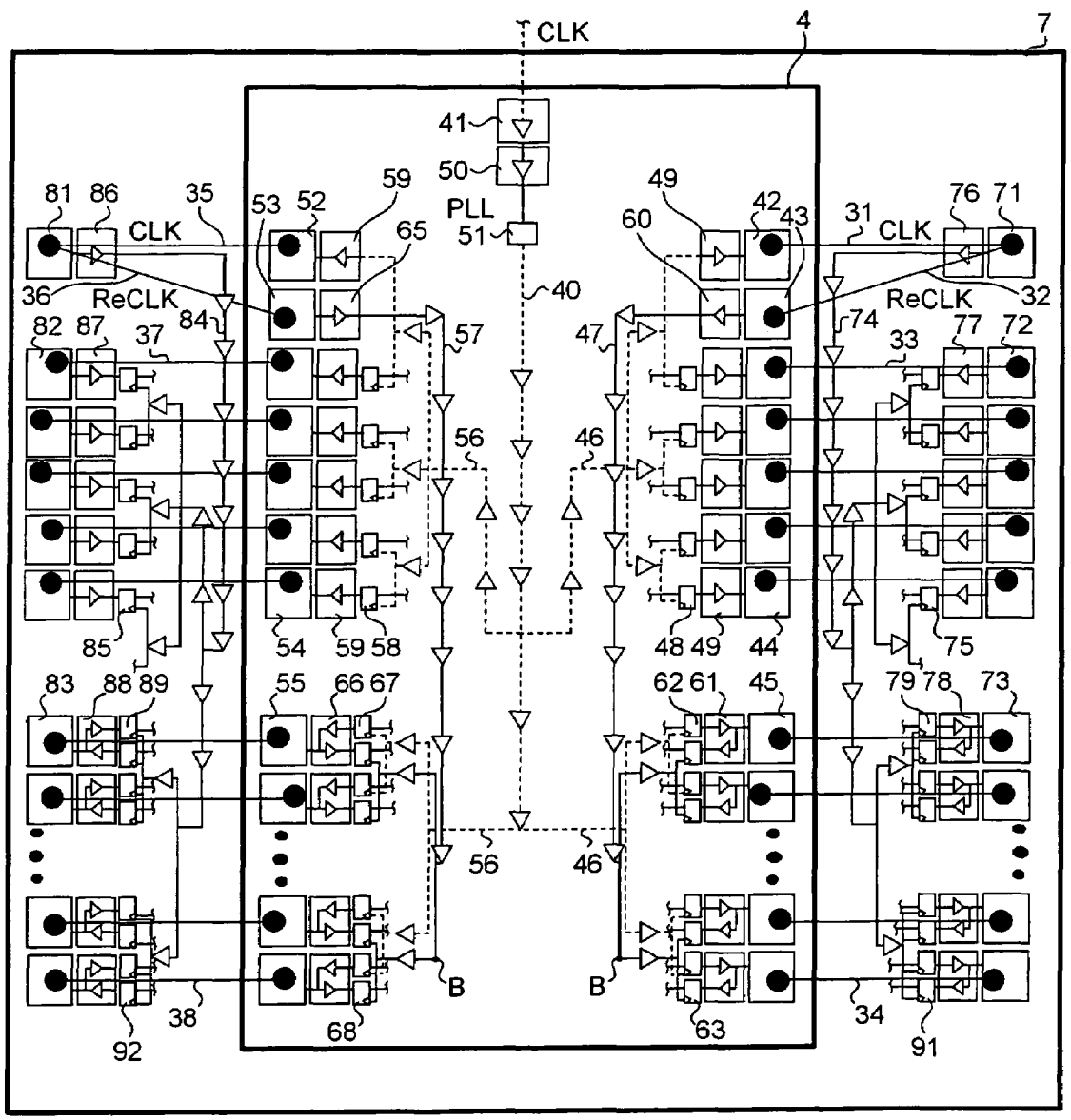
FIG. 4 is a schematic of a multiple chip package according to a first embodiment of the present invention.

FIG. 4 is a schematic of a multiple chip package according to a first embodiment of the present invention. As shown in FIG. 4, a clock output pad 42 that outputs the clock signal CLK, a return clock receiving pad 43 that receives the return clock signal ReCLK, plural output pads 44 that output an address signal and a control signal, and plural input/output pads 45 that input/output data signals are disposed respectively, along the right side of a logic chip 4.

An output buffer circuit 49 is connected to the clock output pad 42. An input buffer circuit 60 is connected to a return clock receiving pad 43. A latch circuit 48 is connected to each output pad 44 via an output buffer circuit 49. An output side latch circuit 62 and an input side latch circuit 63 are connected to each input/output pad 45, via an input/output buffer circuit 61. The latch circuit 48, the output side latch circuit 62, and the input side latch circuit 63 are connected to an internal circuit (not shown) of the logic chip 4.

A clock output pad 52, a return clock receiving pad 53, plural output pads 54, and plural input/output pads 55 are disposed respectively, along the left side of the logic chip 4. An output buffer circuit 59 is connected to the clock output pad 52. An input buffer circuit 65 is connected to the return clock receiving pad 53. A latch circuit 58 is connected to each output pad 54, via the output buffer circuit 59. An output side latch circuit 67 and an input side latch circuit 68 are connected to each input/output pad 55, via an input/output buffer circuit 66. The latch circuit 58, the output side latch circuit 67, and the input side latch circuit 68 are connected to an internal circuit (not shown) of the logic chip 4.

An external clock input pad 41 to which the clock signal CLK of a clock frequency of 27 megahertz, for example, is input from an external signal generator (not shown) is provided in the logic chip 4. A trunk line 40 of a clock tree for the clock signal CLK (hereinafter, "CLK clock tree") is connected to the external clock input pad 41, via an input buffer circuit 50 and a phase-fixing phase locked loop (PLL) circuit 51.

At the right half of the logic chip 4, the clock signal CLK is supplied to each output buffer circuit 49 connected to the clock output pad 42, each clock terminal of the latch circuit 48 connected to each output pad 44, and a clock terminal of the output side latch circuit 62 connected to each input/output buffer 45, respectively, via the trunk line 40 of the CLK clock tree and a right-side branch 46 that is branched from the trunk line 40. A right side 47 of a clock tree for the return clock signal ReCLK (hereinafter, "ReCLK clock tree") is connected to the input buffer circuit 60 that is connected to the return clock receiving pad 43. The return clock signal ReCLK is supplied to the clock terminal of the input side latch circuit 63 that is connected to the input/output pad 45, via the right side 47 of the ReCLK clock tree.

At the left half of the logic chip 4, the clock signal CLK is supplied to each output buffer circuit 59 connected to the clock output pad 52, each clock terminal of the latch circuit 58 connected to each output pad 54, and a clock terminal of the output side latch circuit 67 connected to each input/output buffer 55, respectively, via the trunk line 40 of the CLK clock tree and a left-side branch 56 that is branched from the trunk line 40. A left side 57 of the ReCLK clock tree is connected to the input buffer circuit 65 that is connected to the return clock receiving pad 53. The return clock signal ReCLK is supplied to the clock terminal of the input side latch circuit 68 that is connected to the input/output pad 55, via the left side 57 of the ReCLK clock tree.

A wiring length of the trunk line 40 of the CLK clock tree from the external clock input pad 41 to the right-side output buffer circuit 49, the latch circuit 48, and the output-side latch circuit 62, and to the right-side branch 46 is equal to a wiring length of the trunk line 40 of the CLK clock tree from the external clock input pad 41 to the left-side output buffer circuit 59, the latch circuit 58, and the output-side latch circuit 67, and to the left-side branch 56. A wiring length of the right side 47 of the ReCLK clock tree from the right-side return clock receiving pad 43 to the input-side latch circuit 63 is equal to a wiring length of the left side 57 of the ReCLK clock tree from the left-side return clock receiving pad 53 to the input-side latch circuit 68.

A clock input pad 71 that receives the clock signal CLK, plural input pads 72 that receive address signals and control signals, and plural input/output pads 73 that input/output data signals are disposed respectively, along the right side of the memory chip 7. An input buffer circuit 76 is connected to the clock input pad 71. A latch circuit 75 is connected to each input pad 72, via the input buffer circuit 77. An output side latch circuit 79 and an input side latch circuit 91 are connected to each input/output pad 73, via an input/output buffer circuit 78. The latch circuit 75, the output side latch circuit 79, and the input side latch circuit 91 are connected to an internal circuit (not shown) of the memory chip 7.

A clock input pad 81, plural input pads 82, and plural input/output pads 83 are disposed respectively, along the left side of the memory chip 7. An input buffer circuit 86 is connected to the clock input pad 81. A latch circuit 85 is connected to each input pad 82, via the input buffer circuit 87. An output side latch circuit 89 and an input side latch circuit 92 are connected to each input/output pad 83, via an input/output buffer circuit 88. The latch circuit 85, the output side latch circuit 89, and the input side latch circuit 92 are connected to an internal circuit (not shown) of the memory chip 7.

At the right half of the memory chip 7, the input buffer circuit 76 that is connected to the clock input pad 71 is connected to the right side 74 of the clock tree that supplies the clock signal CLK. The clock signal CLK is supplied to clock terminals of the latch circuits 75, 79, and 91 that are disposed on the right side of the memory chip 7, via the right side 74 of the clock tree. At the left half of the memory chip 7, the input buffer circuit 86 that is connected to the clock input pad 81 is connected to the left side 84 of the clock tree that supplies the clock signal CLK. The clock signal CLK is supplied to clock terminals of the latch circuits 85, 89, and 92 that are disposed on the left side of the memory chip 7, via the left side 84 of the clock tree. A wiring length of the right side 74 of the clock tree is equal to a wiring length of the left side 84 of the clock tree.

Within a package (not shown), the right-side clock output pad 42 of the logic chip 4 is electrically connected to the right-side clock input pad 71 of the memory chip 7, via the wire electrode 31. Therefore, in the right half of the memory chip 7, the input of address signals, control signals, and data signals, and the output of data signals are carried out synchronously with the clock signal CLK that is supplied from the right-side clock output pad 42 of the logic chip 4. The right-side clock input pad 71 of the memory chip 7 is electrically connected to the right-side return clock receiving pad 43 of the logic chip 4, via the wire electrode 32. Therefore, in the right half of the logic chip 4, data signals are input synchronously with the return clock signal ReCLK as a return of the clock signal CLK that is output from the right-side clock output pad 42 of the logic chip 4.

Each right-side output pad 44 of the logic chip 4 is electrically connected to the right-side input pad 72 of the memory chip 7, via the wire electrode 33. Each right-side input/output pad 45 of the logic chip 4 is electrically connected to the right-side input/output pad 73 of the memory chip 7, via a wire electrode 34. Dispositions of the right-side pads 42, 43, 44, and 45 of the logic chip 4 connected to the wire electrodes 31, 32, 33, and 34 are matched with dispositions of the right-side pads 71, 72, and 73 of the memory chip 7 such that the lengths of the wire electrodes 31, 32, 33, and 34 are substantially equal to each other.

Within a package (not shown), the left-side clock output pad 52 of the logic chip 4 is electrically connected to the left-side clock input pad 81 of the memory chip 7, via a wire electrode 35. Therefore, in the left half of the memory chip 7, the input of address signals, control signals, and data signals, and the output of data signals are carried out synchronously with the clock signal CLK that is supplied from the left-side clock output pad 52 of the logic chip 4. The left-side clock input pad 81 of the memory chip 7 is electrically connected to the left-side return clock receiving pad 53 of the logic chip 4, via a wire electrode 36. Therefore, in the left half of the logic chip 4, data signals are input synchronously with the return clock signal ReCLK as a return of the clock signal CLK that is output from the left-side clock output pad 52 of the logic chip 4.

Each left-side output pad 54 of the logic chip 4 is electrically connected to the left-side input pad 82 of the memory chip 7, via a wire electrode 37. Each left-side input/output pad 55 of the logic chip 4 is electrically connected to the left-side input/output pad 83 of the memory chip 7, via a wire electrode 38. Dispositions of the left-side pads 52, 53, 54, and 55 of the logic chip 4 connected to the wire electrodes 35 36, 37, and 38 are matched with dispositions of the left-side pads 81, 82, and 83 of the memory chip 7 such that the lengths of the wire electrodes 35, 36, 37, and 38 are substantially equal to each other. The lengths of the right-side wire electrodes 31, 32, 33, and 34 of the logic chip 4 are substantially equal to the lengths of the left-side wire electrodes 35 36, 37, and 38. Therefore, it is easy to adjust timings between pads of the logic chip 4.

Figure 1:
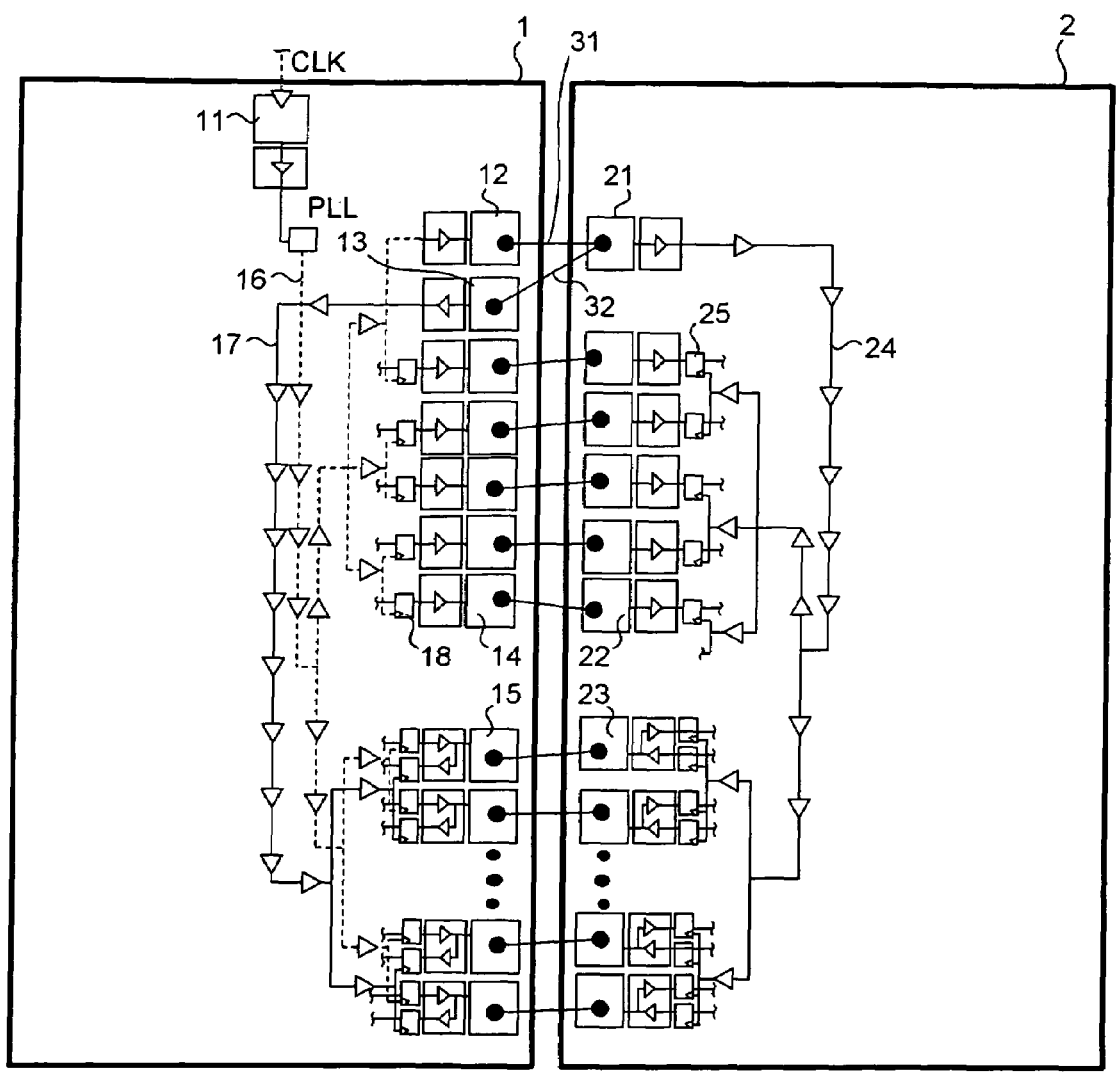
FIG. 1 is a schematic of a conventional horizontal multiple chip package.
Figure 2:
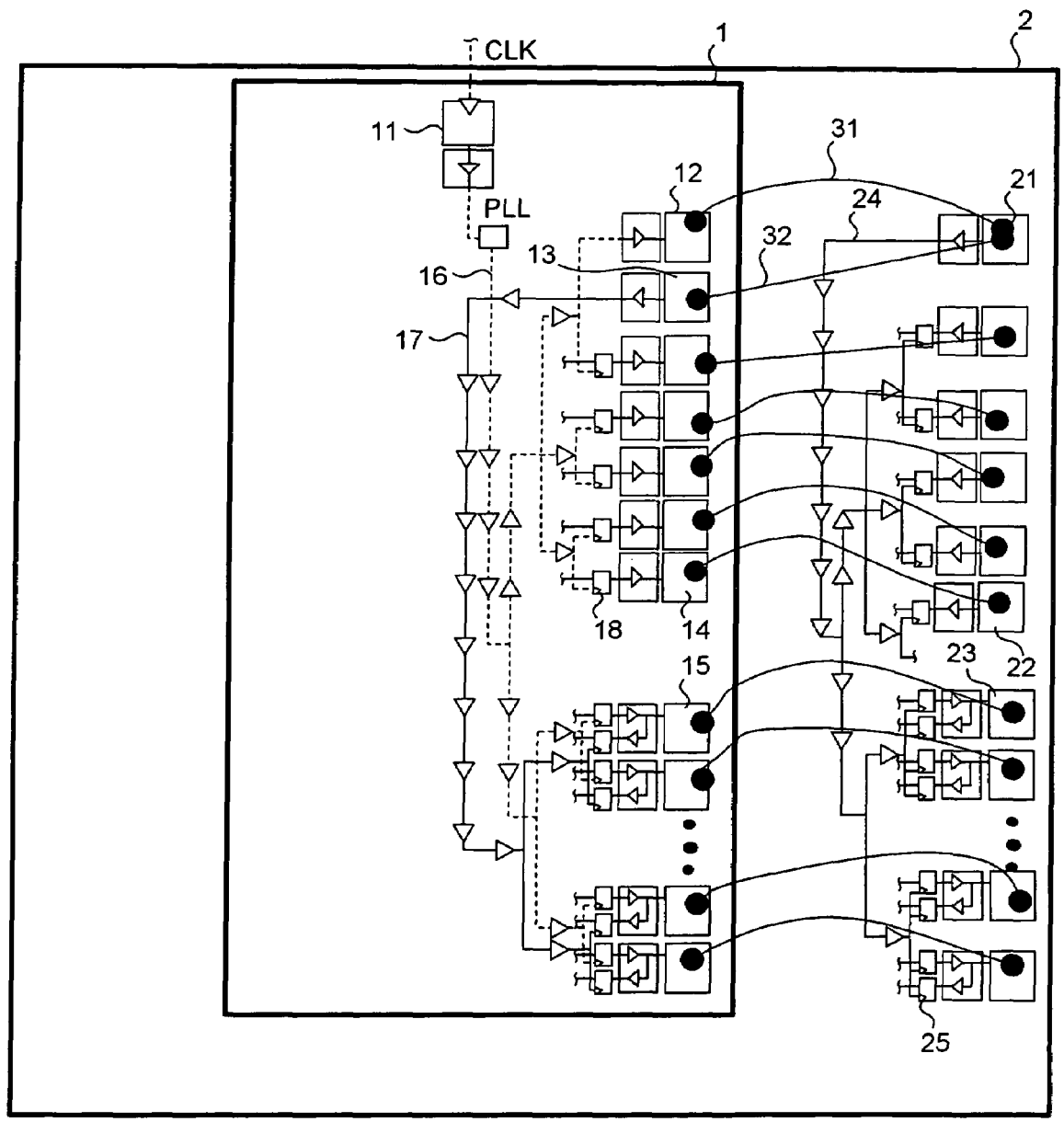
FIG. 2 is a schematic of a conventional stacked multiple chip package.
Figure 3:
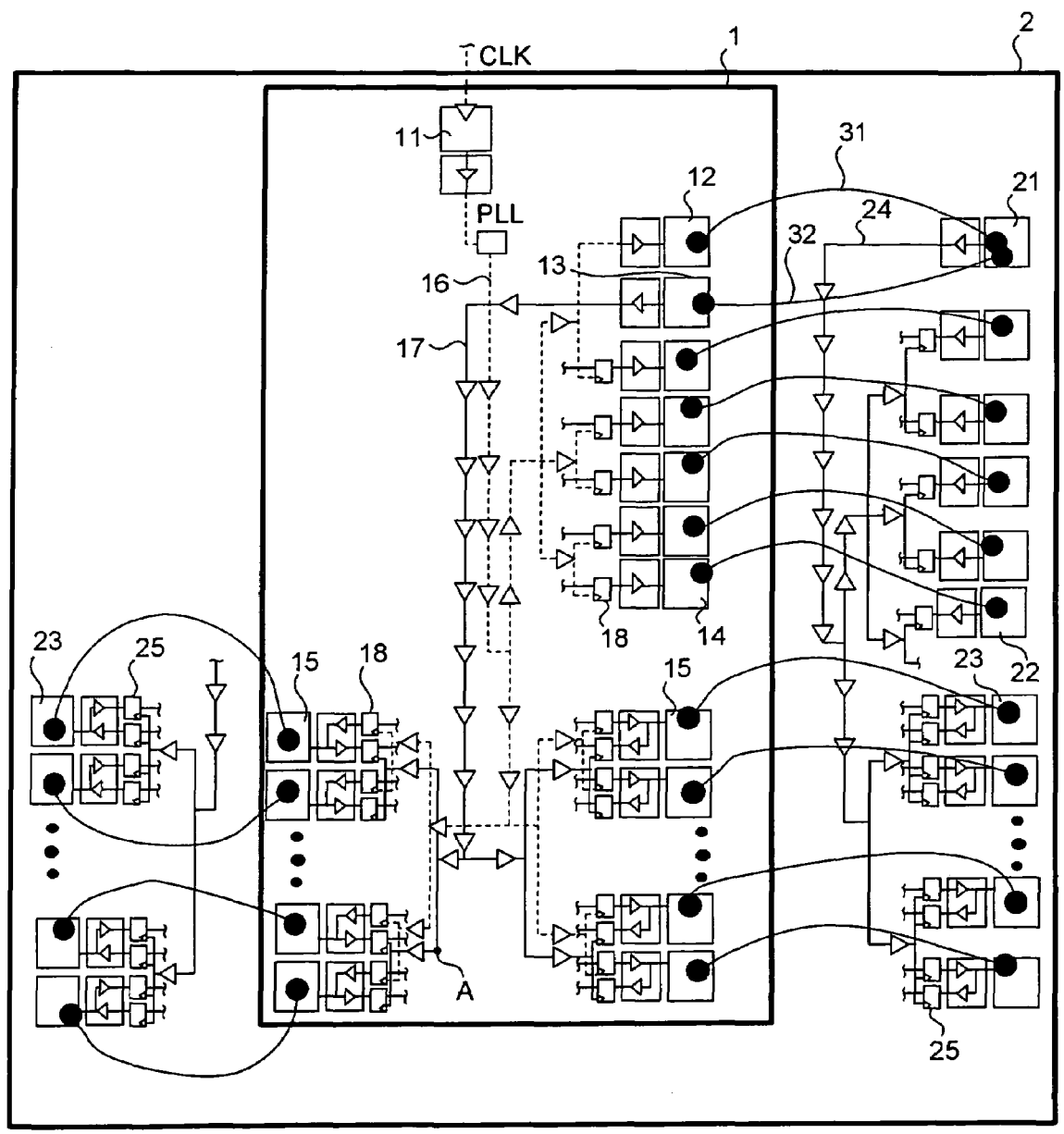
FIG. 3 is a schematic of a conventional stacked multiple chip package having multiple pins.
Figure 5:
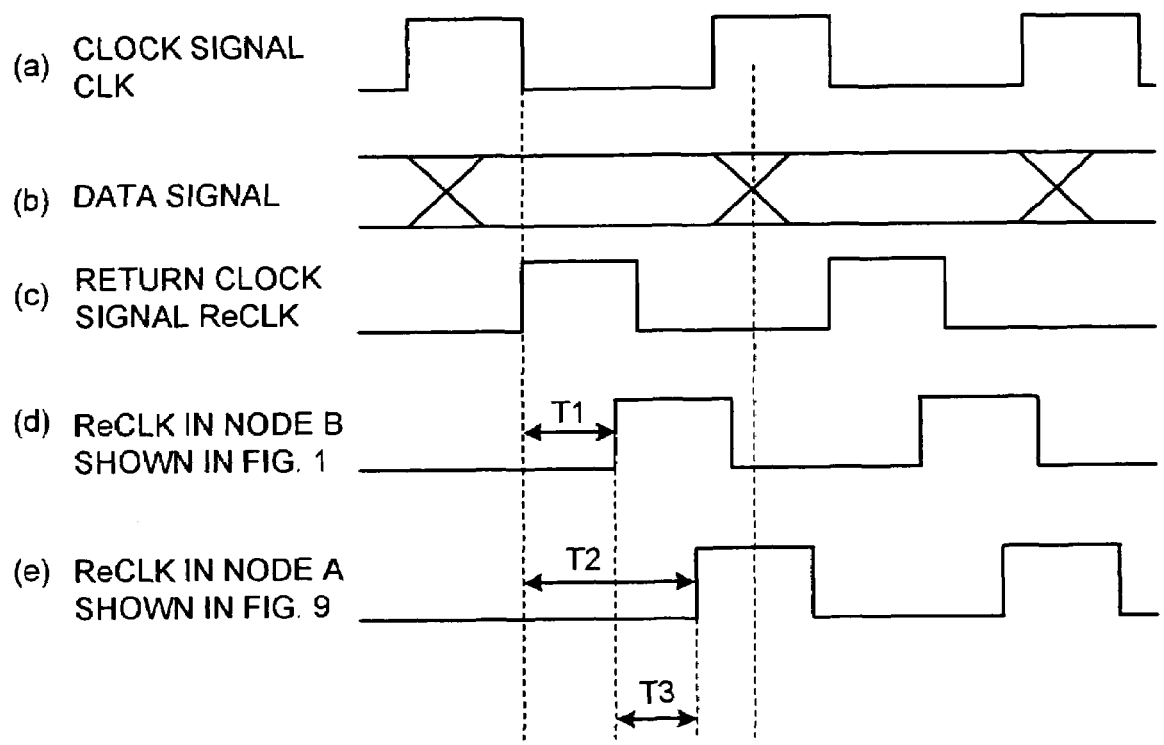
FIG. 5A to FIG. 5E are schematics of waveforms for explaining signal delay levels in a configuration shown in FIG. 4 and a configuration shown in FIG. 3.

FIG. 5A to FIG. 5E are schematics of waveforms for explaining signal delay levels in a configuration according to the first embodiment shown in FIG. 4 and a configuration of the conventional stacked multiple chip package shown in FIG. 3. A waveform of the clock signal CLK is shown in FIG. 5A, a waveform of a data signal is shown in FIG. 5B, and a waveform of the return clock signal ReCLK is shown in FIG. 5C. As shown in FIG. 5D, in the configuration shown in FIG. 4, the return clock signal ReCLK that is input to the return clock receiving pads 43 and 53 reaches a node B (the furthest node from the return clock receiving pads 43 and 53) shown in FIG. 4, with a time delay of T1. On the other hand, as shown in FIG. 5E, in the configuration shown in FIG. 3, the return clock signal ReCLK that is input to the return clock receiving pad 13 reaches a node A (the furthest node from the return clock receiving pad 13) shown in FIG. 3, with a time delay of T2. The time delay T1 is smaller than the time delay T2.

The time delay according to the configuration shown in FIG. 4 is smaller than the time delay according to the configuration shown in FIG. 3, for the following reason. According to the configuration shown in FIG. 3, the return clock receiving pad 13 is provided on only one side of the logic chip1. On the other hand, according to the configuration shown in FIG. 4, the return clock receiving pads 43 and 53 are provided on both the left and the right sides of the logic chip 4. Therefore, the wiring length of the ReCLK clock tree becomes shorter than the conventional wiring length by that portion.

According to the first embodiment, there is a margin in the delay time of the return clock signal ReCLK, corresponding to the difference between the time T1 and the time T2 (time T3). Therefore, there is allowance in the delay time within the logic chip 4. As a result, it becomes easy to adjust timing within the logic chip 4. Consequently, there is allowance in the clock cycle. This means that even if it is necessary to adjust the timing of the return clock signal ReCLK on the left side and the right side of the logic chip 4, this allowance is sufficient enough to compensate for this adjustment.

Figure 6:
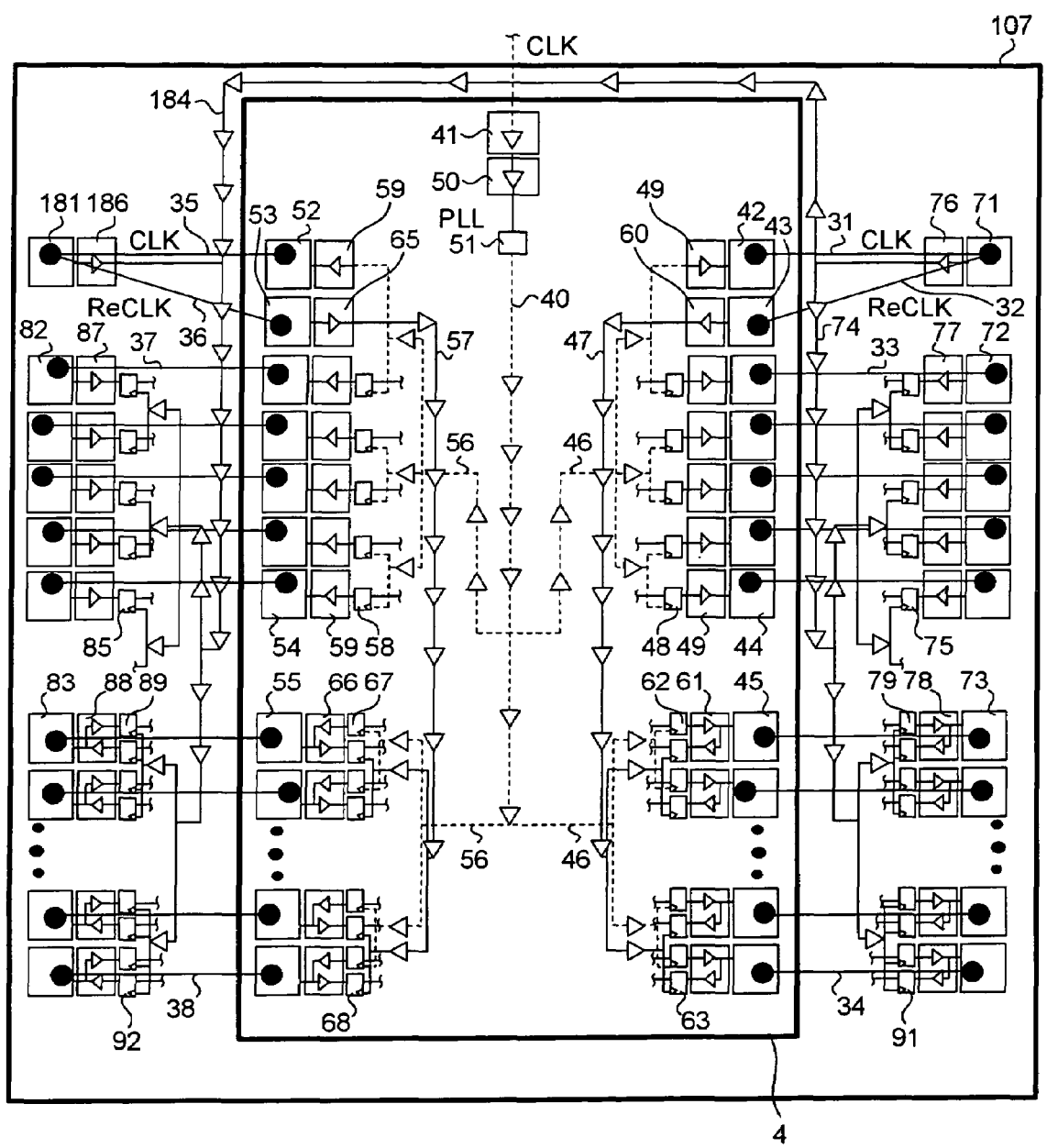
FIG. 6 is a schematic of a multiple chip package according to a second embodiment of the present invention.

FIG. 6 is a schematic of a multiple chip package according to a second embodiment of the present invention. As shown in FIG. 6, according to the second embodiment, a memory chip 107 having a dummy pad 181 and a dummy input buffer circuit 186 is used, in place of the memory chip 7 having the clock input pad 81 and the input buffer circuit 86 according to the first embodiment (see FIG. 4). The dummy input buffer circuit 186 is not connected to an internal circuit of the memory chip 107. Further, a clock tree 184 that connects the latch circuits 85, the output-side latch circuits 89, and the input-side latch circuits 92 that are disposed at the left side of the memory chip 107 to the input buffer circuit 76 of the clock signal CLK disposed at the right side of the memory chip 107 is provided, in place of the left side 84 of the clock tree according to the first embodiment.

In other words, according to the second embodiment, the input/output timings of signals at the left side of the memory chip 107 are controlled based on the clock signal CLK that is input to the right side of the memory chip 107. A configuration and a size of the dummy pad 181 are the same as those of the clock input pad 81. A configuration and a size of the dummy input buffer circuit 186 are the same as those of the input buffer circuit 86. The dummy pad 181 is electrically connected to the clock output pad 52 at the left side of the logic chip 4 via the wire electrode 35, and is also electrically connected to the return clock receiving pad 53 at the left side of the logic chip 4 via the wire electrode 36.

Therefore, the input/output timings of signals at the left side of the logic chip 4 are controlled based on the return clock signal ReCLK that is output from the left-side clock output pad 52 and is returned to the left-side return clock receiving pad 53 via the dummy pad 181. Other configurations are similar to those according to the first embodiment. According to the second embodiment, in the same manner as in the first embodiment, the delay time of the return clock signal ReCLK is reduced. The reduced delay time gives a margin in adjusting timing within the logic chip 4. Therefore, it becomes easy to adjust timing within the logic 4.

Figure 7:
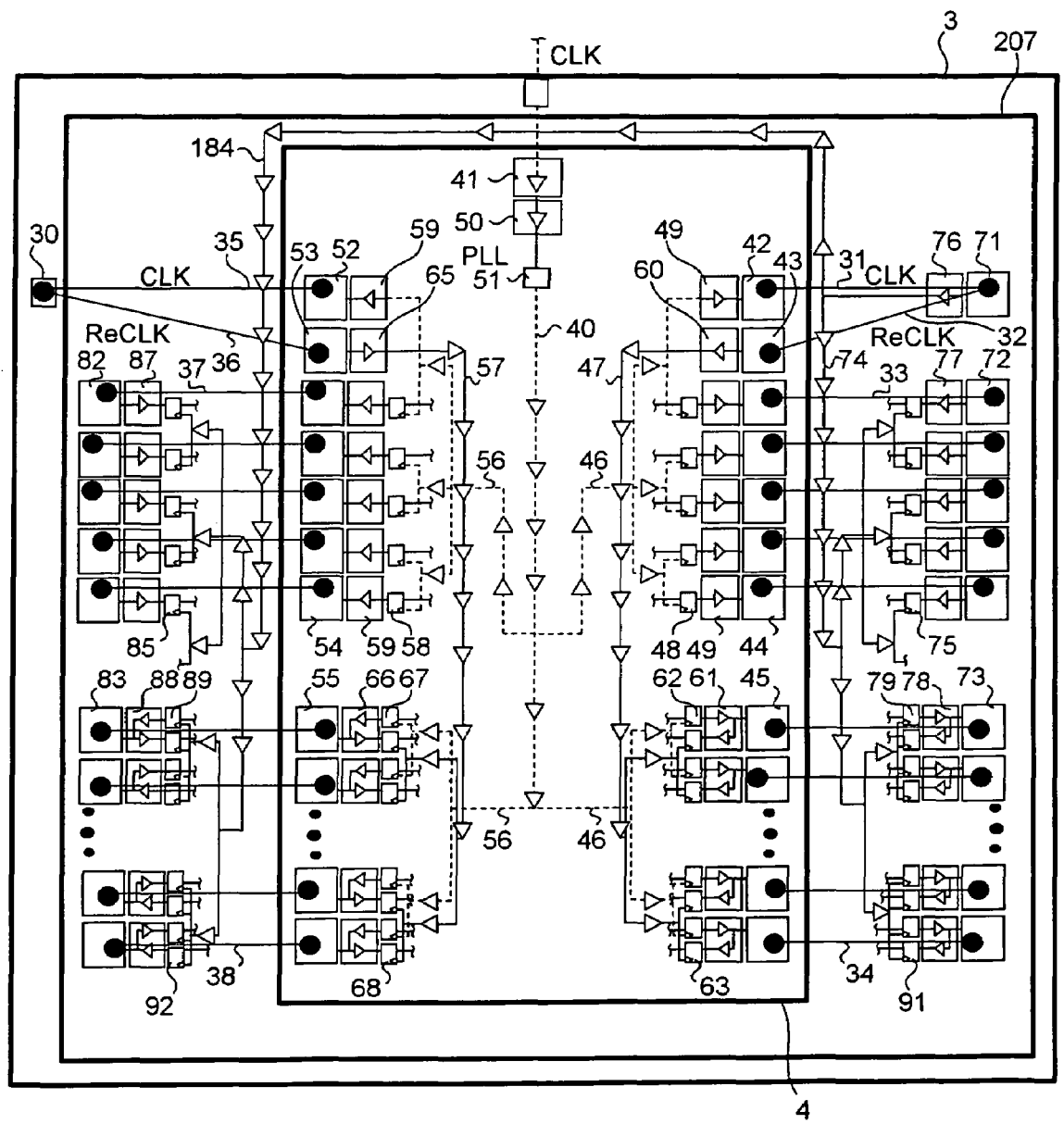
FIG. 7 is a schematic of a multiple chip package according to a third embodiment of the present invention.

FIG. 7 is a schematic of a multiple chip package according to a third embodiment of the present invention. As shown in FIG. 7, according to the third embodiment, a memory chip 207 that does not have the dummy pad 181 and the dummy input buffer circuit 186 of the memory chip 107 shown in FIG. 6 is used, in place of the memory chip 107 according to the second embodiment. A dummy pad 30 is provided on the substrate 3 of the package, in place of the dummy pad 181. The dummy pad 30 is electrically connected to the clock output pad 52 at the left side of the logic chip 4 via the wire electrode 35, and is also connected to the return clock receiving pad 53 at the left side of the logic chip 4 via the wire electrode 36.

Therefore, similar to the second embodiment, the input/output timings of signals at the left side of the logic chip 4 are controlled based on the return clock signal ReCLK that is output from the left-side clock output pad 52 and is returned to the left-side return clock receiving pad 53 via the dummy pad 30. The dummy pad 30 is not connected to the internal circuit of the substrate 3 of the package or the internal circuits of the logic chip 4 and the memory chip 207. Other configurations are similar to those according to the second embodiment. According to the third embodiment, in the same manner as in the second embodiment, the delay time of the return clock signal ReCLK is reduced. The reduced delay time gives a margin in adjusting timing within the logic chip 4. Therefore, it becomes easy to adjust timing within the logic 4.

Figure 8:
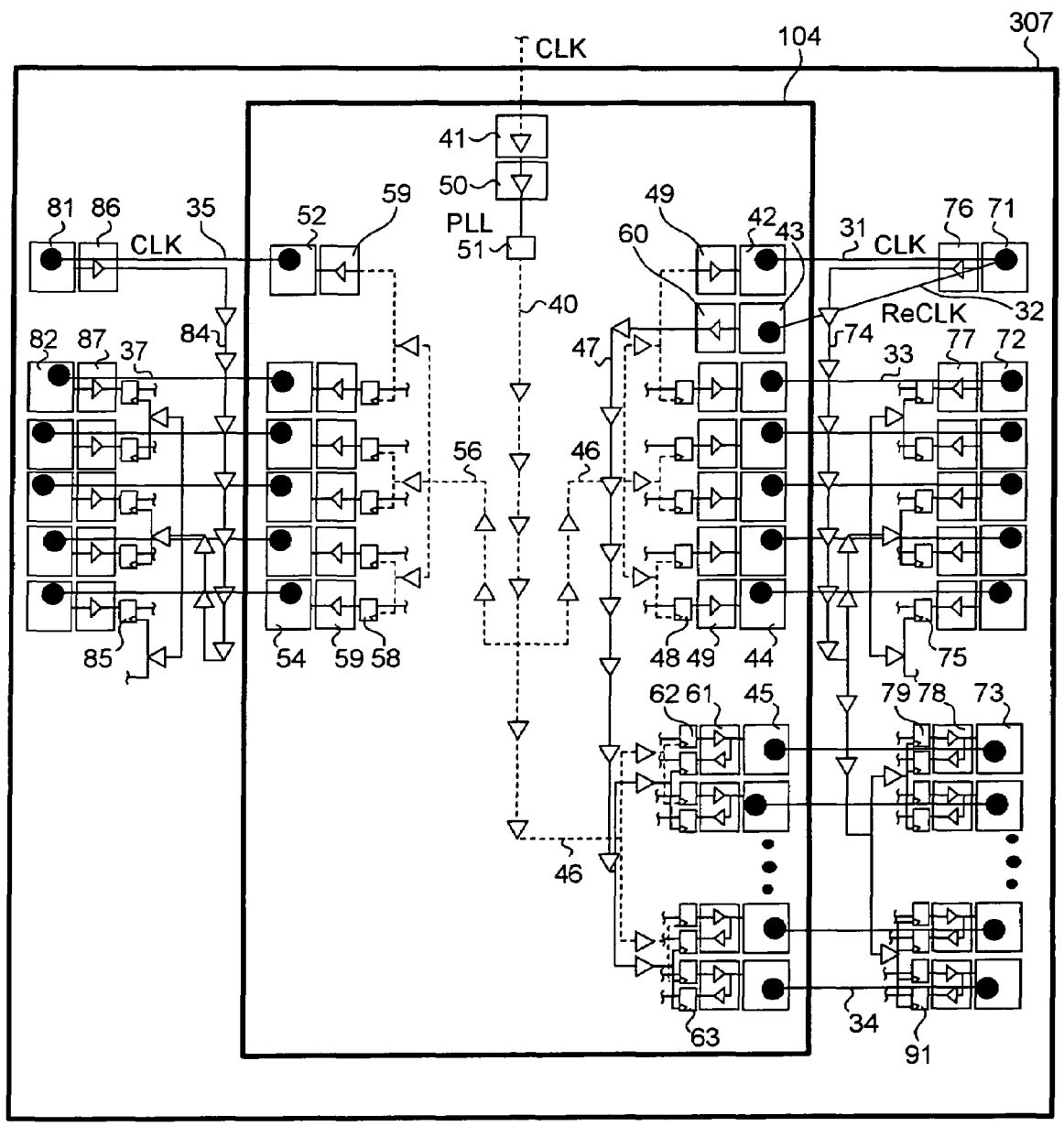
FIG. 8 is a schematic of a multiple chip package according to a fourth embodiment of the present invention.

FIG. 8 is a schematic of a multiple chip package according to a fourth embodiment of the present invention. As shown in FIG. 8, according to the fourth embodiment, a logic chip 104 and a memory chip 307 in which the input/output pads 45 and 73 of data signals are disposed along only one side, that is, the right side in the example shown in FIG. 8, are used, in place of the logic chip 4 and the memory chip 7 according to the first embodiment. Because the logic chip 104 does not receive a data signal at the left side, the left-side return clock receiving pad 53 that receives the return clock signal ReCLK and the input buffer circuit 86 connected to the return clock receiving pad 53 shown in FIG. 4 are not present. Other configurations are similar to those according to the first embodiment.

Figure 9:
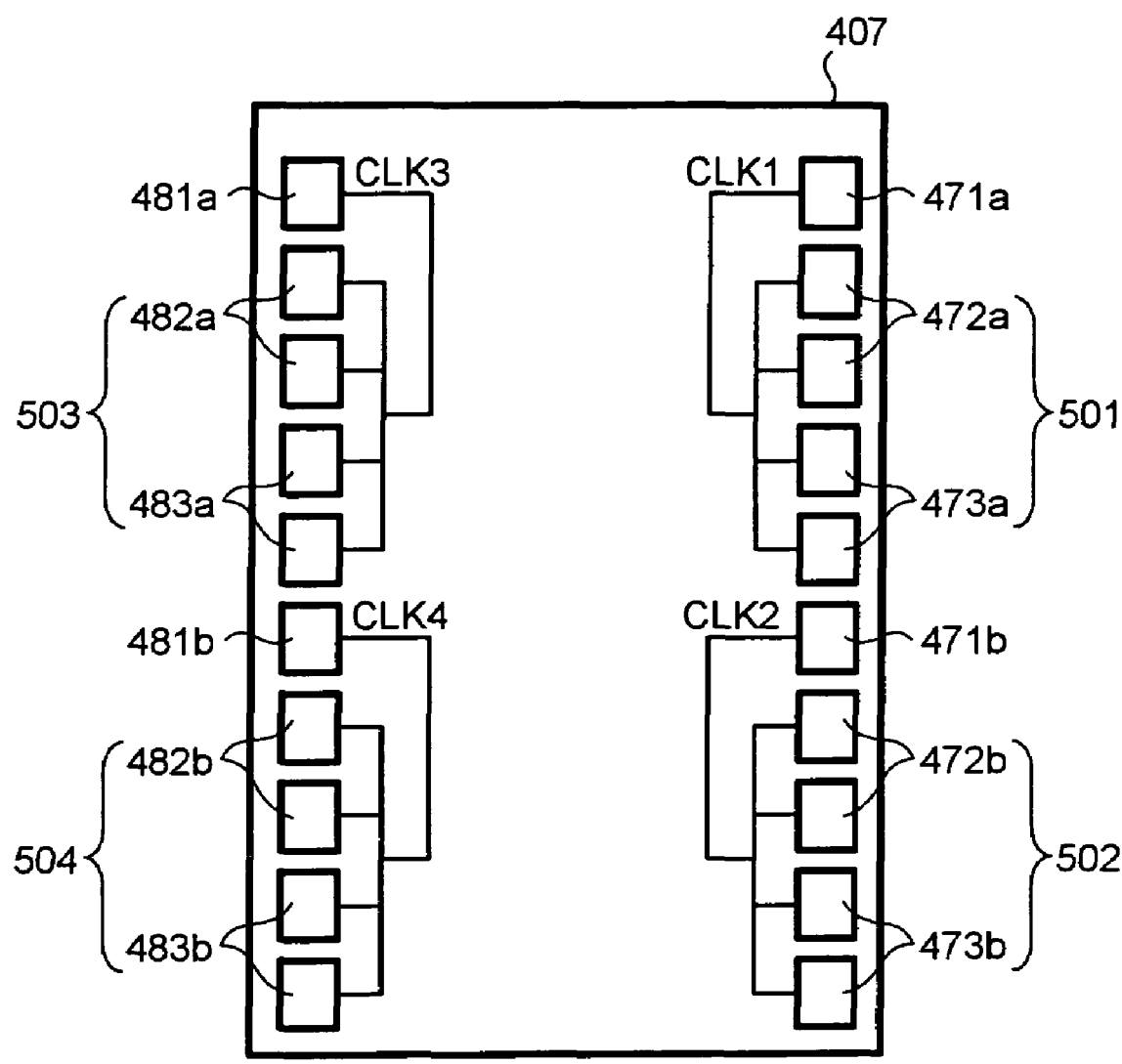
FIG. 9 is a plan view of an IC chip according to a fifth embodiment of the present invention.

FIG. 9 is a plan view of an IC chip according to a fifth embodiment of the present invention. As shown in FIG. 9, a memory chip 407 has three or more groups of pads, and in the example, has four pad groups 501, 502, 503, and 504. Input/output timings of signals in the pad groups 501, 502, 503, and 504 are controlled based on mutually different clock signals CLK1, CLK2, CLK3, and CLK4, respectively. For example, the first pad group 501 is disposed at an upper part on the right side, and includes input pads 472a and input/output pads 473a. The first pad group 501 is controlled based on the first clock signal CLK1 that is supplied to a first clock input pad 471a.

The second pad group 502 is disposed at a lower part on the right side, and includes input pads 472b and input/output pads 473b. The second pad group 502 is controlled based on the second clock signal CLK2 that is supplied to a second clock input pad 471b. The third pad group 503 is disposed at an upper part on the left side, and includes input pads 482a and input/output pads 483a. The third pad group 503 is controlled based on the third clock signal CLK3 that is supplied to a third clock input pad 481a.

The fourth pad group 504 is disposed at a lower part on the left side, and includes input pads 482b and input/output pads 483b. The fourth pad group 504 is controlled based on the fourth clock signal CLK4 that is supplied to a fourth clock input pad 481b. There can be three or five pad groups. Two pad groups are present according to the first embodiment and the fourth embodiment.

As explained above, each clock signal CLK is supplied from the left and the right sides of the memory chips 7 and 307. Therefore, the wiring lengths of the clock trees 74 and 84 within the memory chips 7 and 307 become short, and the delay in the clock signal CLK becomes small. Further, each return clock signal ReCLK is supplied from the left and the right sides of the logic chip 4. Therefore, the wiring lengths of the clock trees 47 and 57 of the return clock signal CLK within the logic chip 4 become short, and the delay in the return clock signal ReCLK becomes small. As a result, it becomes easy to adjust timing within the logic chip 4 and the memory chips 7 and 307, respectively, thereby improving the band width. It becomes also easy to adjust timing between the logic chips 4 and 104 and the memory chips 7, 107, 207, and 307, respectively.

The present invention is not limited to the above embodiments, and can be variously modified. For example, the first IC chip is not limited to the logic chip, and can be the IC chip that has a function of outputting the clock signal CLK. The second IC chip is not limited to the memory chip, and can be the IC chip that has a function of receiving the clock signal CLK. The multiple chip package can also have the following configuration. In electrically connecting between the electrode pad of the first IC chip and the electrode pad of the second IC chip, the electrode pad of the first IC chip is electrically connected to the electrode pad of the substrate of the package using a wire electrode. Further, the electrode pad of the substrate of the package is electrically connected to the electrode pad of the second IC chip using a separate wire electrode. The present invention also includes the above configuration, and when the configuration is applied, the second IC chip includes the substrate of the package.

According to the present invention, it is possible to easily adjust timings within each IC chip and adjust timings between the IC chips.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A multiple chip package that accommodates a plurality of integrated circuit chips, comprising:
   a first integrated circuit chip that includes a first clock output pad and a second clock output pad that are arranged at opposite sides of the first integrated circuit chip, and a first return clock receiving pad and a second return clock receiving pad that are arranged at the opposite sides, respectively; and
   a second integrated circuit chip that is arranged under the first integrated circuit chip, and includes a first clock receiving pad and a second clock receiving pad that are arranged near the opposite sides, respectively, wherein
   a clock signal input to the first integrated circuit chip is:
      output from the first clock output pad, received by the first clock receiving pad, and returned therefrom to the first return clock receiving pad, and
      output from the second clock output pad, received by the second clock receiving pad, and return therefrom to the second return clock receiving pad.

2. The multiple chip package according to claim 1, wherein
   the second integrated circuit chip includes a plurality of pad groups, each of the pad groups including a plurality of pads, and
   an input and an output of a signal to and from each of the pad groups are controlled based on a clock signal for each of the pad groups.

* * * * *